(12) United States Patent
Pan et al.

(10) Patent No.: US 11,658,225 B2
(45) Date of Patent: May 23, 2023

(54) FIN FIELD-EFFECT TRANSISTOR AND METHOD OF FORMING THE SAME

(71) Applicant: Taiwan Semiconductor Manufacturing Company, Ltd., Hsinchu (TW)

(72) Inventors: Yu-Chi Pan, Zhubei (TW); Ying-Liang Chuang, Zhubei (TW); Ming-Hsi Yeh, Hsinchu (TW); Kuo-Bin Huang, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/874,772

(22) Filed: Jul. 27, 2022

(65) Prior Publication Data
US 2022/0359692 A1    Nov. 10, 2022

Related U.S. Application Data

(63) Continuation of application No. 17/097,499, filed on Nov. 13, 2020, now Pat. No. 11,404,552.

(51) Int. Cl.
| | |
|---|---|
| *H01L 29/423* | (2006.01) |
| *H01L 29/78* | (2006.01) |
| *H01L 29/66* | (2006.01) |
| *H01L 27/088* | (2006.01) |
| *H01L 29/51* | (2006.01) |
| *H01L 21/28* | (2006.01) |
| *H01L 21/8238* | (2006.01) |
| *H01L 27/092* | (2006.01) |
| *H01L 21/8234* | (2006.01) |
| *H01L 21/311* | (2006.01) |

(52) U.S. Cl.
CPC .. *H01L 29/42368* (2013.01); *H01L 21/28185* (2013.01); *H01L 21/823431* (2013.01); *H01L 21/823821* (2013.01); *H01L 27/0886* (2013.01); *H01L 27/0924* (2013.01); *H01L 29/513* (2013.01); *H01L 29/66795* (2013.01); *H01L 29/785* (2013.01); *H01L 29/7856* (2013.01); *H01L 21/31122* (2013.01); *H01L 21/82345* (2013.01)

(58) Field of Classification Search
CPC ........ H01L 29/42368; H01L 29/66795; H01L 29/785; H01L 21/823431; H01L 21/823821; H01L 27/0886; H01L 27/0924
See application file for complete search history.

(56) References Cited

U.S. PATENT DOCUMENTS

2017/0125408 A1    5/2017    Park et al.

*Primary Examiner* — Joseph C. Nicely
(74) *Attorney, Agent, or Firm* — Foley & Lardner LLP

(57) ABSTRACT

A semiconductor device includes a fin structure disposed over a substrate. The semiconductor device includes a first interfacial layer straddling the fin structure. The semiconductor device includes a gate dielectric layer extending along sidewalls of the fin structure. The semiconductor device includes a second interfacial layer overlaying a top surface of the fin structure. The semiconductor device includes a gate structure straddling the fin structure. The first interfacial layer and the gate dielectric layer are disposed between the sidewalls of the fin structure and the gate structure.

20 Claims, 17 Drawing Sheets

FIN FIELD-EFFECT TRANSISTOR AND METHOD OF FORMING THE SAME

CROSS-REFERENCE TO RELATED APPLICATIONS

The present application is a continuation of U.S. Non-Provisional patent application Ser. No. 17/097,499, filed on Nov. 13, 2020, and titled "Fin Field-Effect Transistor and Method of Forming the Same," the entire disclosure of which is incorporated herein by reference.

BACKGROUND

The present disclosure generally relates to semiconductor devices, and particularly to methods of making a non-planar transistor.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a tri-gate FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
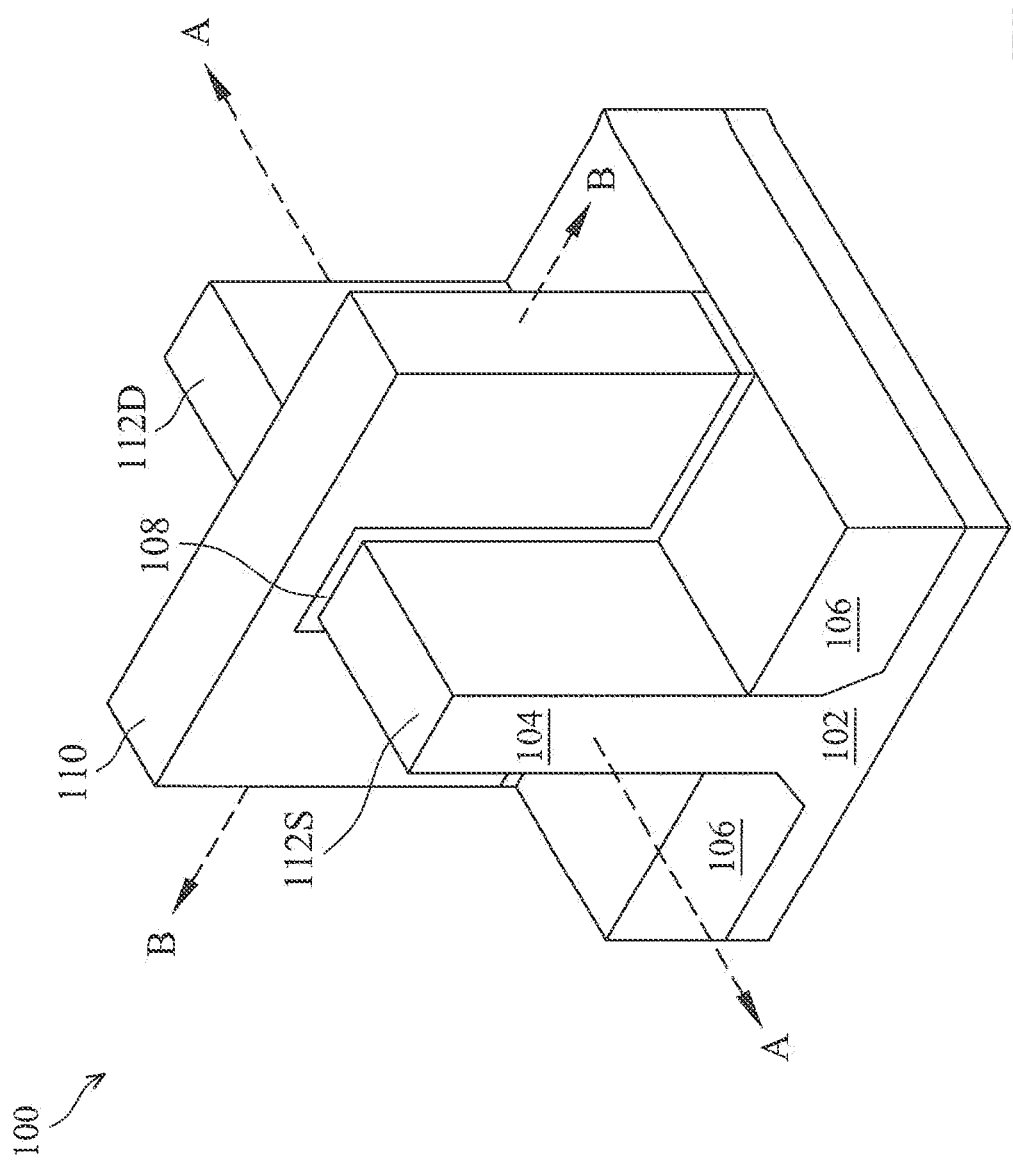
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming a replacement gate of a FinFET device. In the existing technologies, in order to have multiple threshold voltages for respective FinFETs, different combinations of one or more work function layers are formed over fin structures that partially function as respective (metal) gate structures. To achieve such different combinations of work function layers, one or more etching processes are required to etch back some of the work function layers. While etching the work function layers, a top surface of the fin structure (or one or more layers formed on top of the fin structure, which are intended to protect the fin structure from the etching processes) may be damaged. Consequently, a leakage path can be formed through the damaged portion, which may disadvantageously affect overall performance of the FinFETs.

The present disclosure provides various embodiments of a FinFET device, which is immune from the above-identified issues, and methods to form the same. In some embodiments, a first interfacial layer may be first formed to straddle a fin structure. Next, a gate dielectric layer is formed over the first interfacial layer, followed by deposition of a sacrificial layer. The sacrificial layer may be characterized with a high enough etching rate with respect to a certain isotropic etching process. Through an anisotropic etching process, the etching characteristic of a portion of the gate dielectric layer (e.g., the portion over a top surface of the fin structure) may be changed. For example, the changed portion of the gate dielectric layer may be removed together with the sacrificial layer via the isotropic etching process, which exposes a portion of the first interfacial layer. Next, a second interfacial layer can be grown over the exposed portion of the first interfacial layer, functioning as a protection layer over the top surface of the fin structure. As such, different combinations of work function layers (through a number of etching back processes) can be formed over the fin structure, while not damaging the fin structure.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source/drain structures 112S and 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain structures 110. Subsequent figures refer to these reference cross-sections for clarity.

Figure 2:
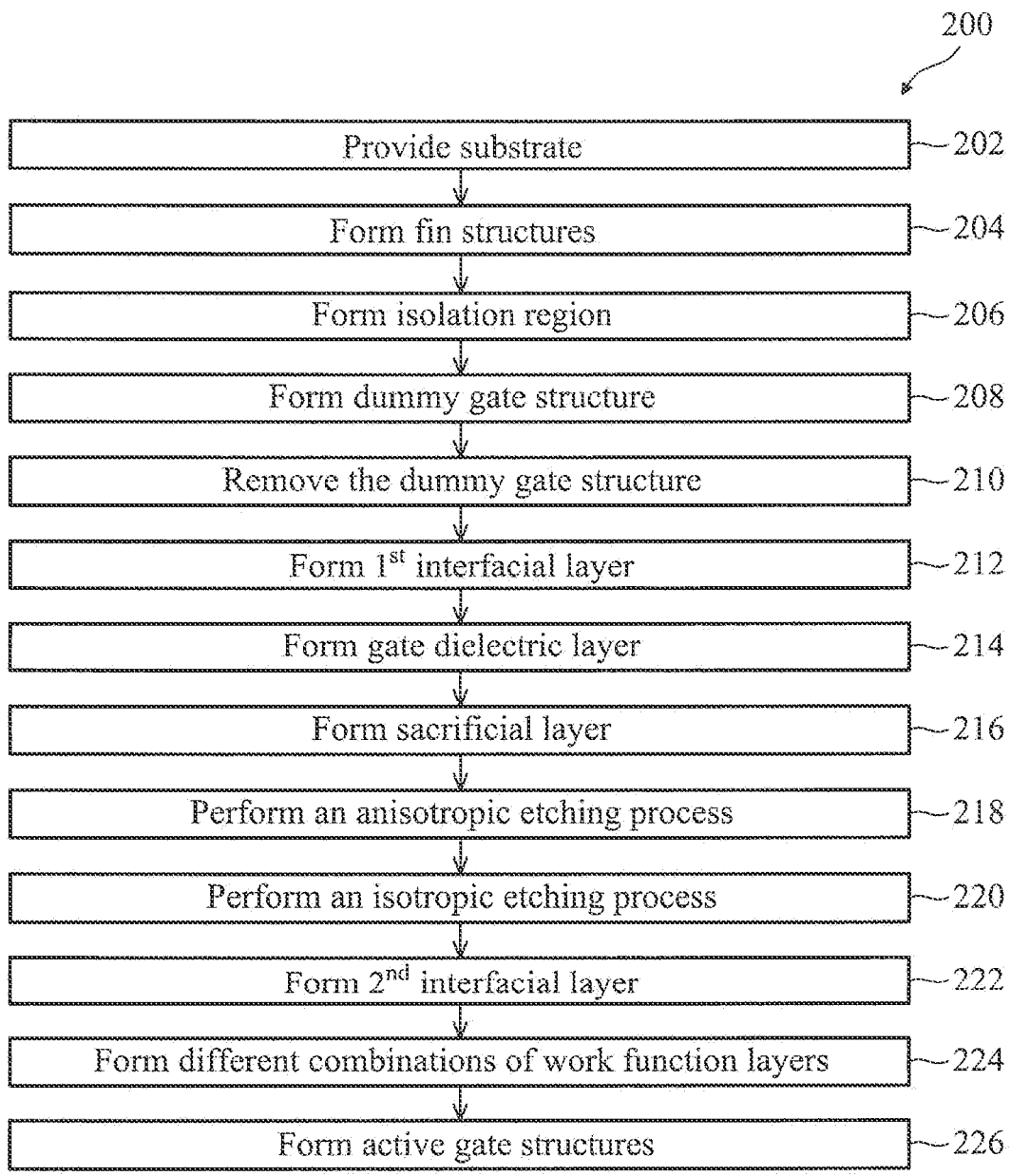
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations of the method 200 can be used to form a FinFET device (e.g., FinFET device 100), a nanosheet transistor device, a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8A, 8B, 9, 10, 11, 12, 13, 14, 15, and 16, respectively, which will be discussed in further detail below.

In brief overview, the method 200 starts with operation 202 of providing a substrate. The method 200 continues to operation 204 of forming fin structures. The method 200 continues to operation 206 of forming an isolation region. The method 200 continues to operation 208 of forming a dummy gate structure. The dummy gate structure may straddle a respective portion of each of the fin structures. The method 200 continues to operation 210 of removing the dummy gate structure. Upon the dummy gate structure being removed, a gate trench is formed. The method 200 continues to operation 212 of forming a first interfacial layer. The method 200 continues to operation 214 of forming a gate dielectric layer. The method 200 continues to operation 216 of forming a sacrificial layer. The method 200 continues to operation 218 of performing an anisotropic etching process. The method 200 continues to operation 220 of performing an isotropic etching process. The method 200 continues to operation 222 of forming a second interfacial layer. The method 200 continues to operation 224 of forming different combinations of one or more work function layers. The method 200 continues to operation 226 of forming a number of active gate structures.

As mentioned above, FIGS. 3-16 each illustrate, in a cross-sectional view, a portion of a FinFET device 300 at various fabrication stages of the method 200 of FIG. 2. The FinFET device 300 is substantially similar to the FinFET device 100 shown in FIG. 1. Although FIGS. 3-16 illustrate the FinFET device 300, it is understood the FinFET device 300 may include a number of other devices such as inductors, fuses, capacitors, coils, etc., which are not shown in FIGS. 3-16, for purposes of clarity of illustration.

Figure 3:
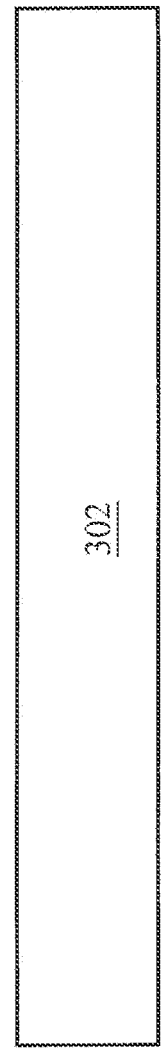
FIGS. 3, 4, 5, 6, 7, 8A, 8B, 9, 10, 11, 12, 13, 14, 15, and 16 illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along the lengthwise direction of a dummy or an active gate structure (e.g., cross-section B-B, as indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
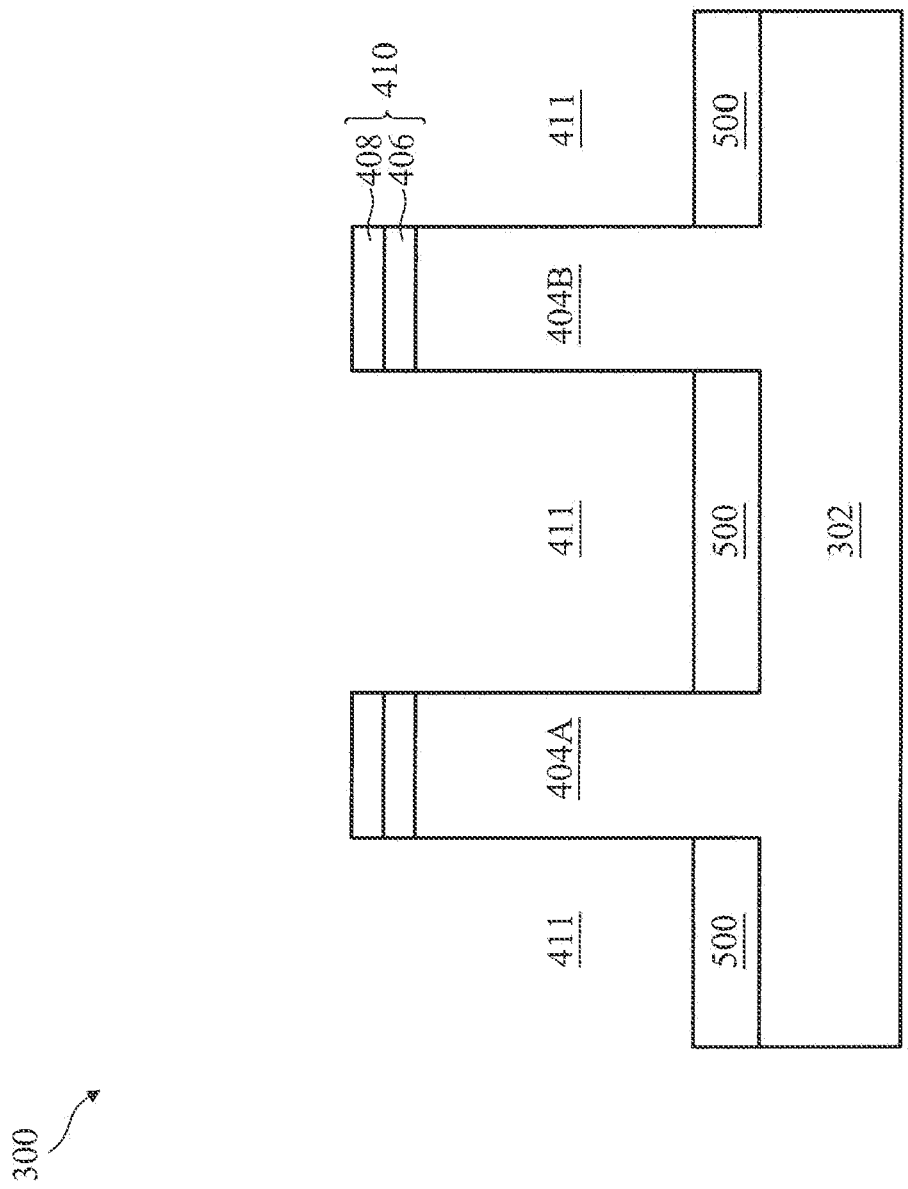

Corresponding to operation 204 of FIG. 2, FIG. 4 is a cross-sectional view of the FinFET device 300 including (semiconductor) fin structures 404A and 404B at one of the various stages of fabrication. The cross-sectional view of FIG. 4 is cut along the lengthwise direction of a dummy or an active gate structure (e.g., cross-section B-B, as indicated in FIG. 1).

Although two fin structures are shown in the illustrated embodiment of FIG. 4 (and the following figures), it should be appreciated that the FinFET device 300 can include any number of fin structures while remaining within the scope of the present disclosure. In some embodiments, the fin structures 404A-B are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining a fin structure (e.g., 404A, 404B) between adjacent trenches 411 as illustrated in FIG. 4. When multiple fin structures are formed, such a trench may be disposed between any adjacent ones of the fin structures. In some embodiments, the fin structures 404A-B are formed by etching trenches in the substrate 302 using, for example, reactive ion etch (ME), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround each of the fin structures 404A-B. The fin structures 404A-B may sometimes be referred to as fin 404 hereinafter.

The fin 404 may be patterned by any suitable method. For example, the fin 404 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

Figure 5:
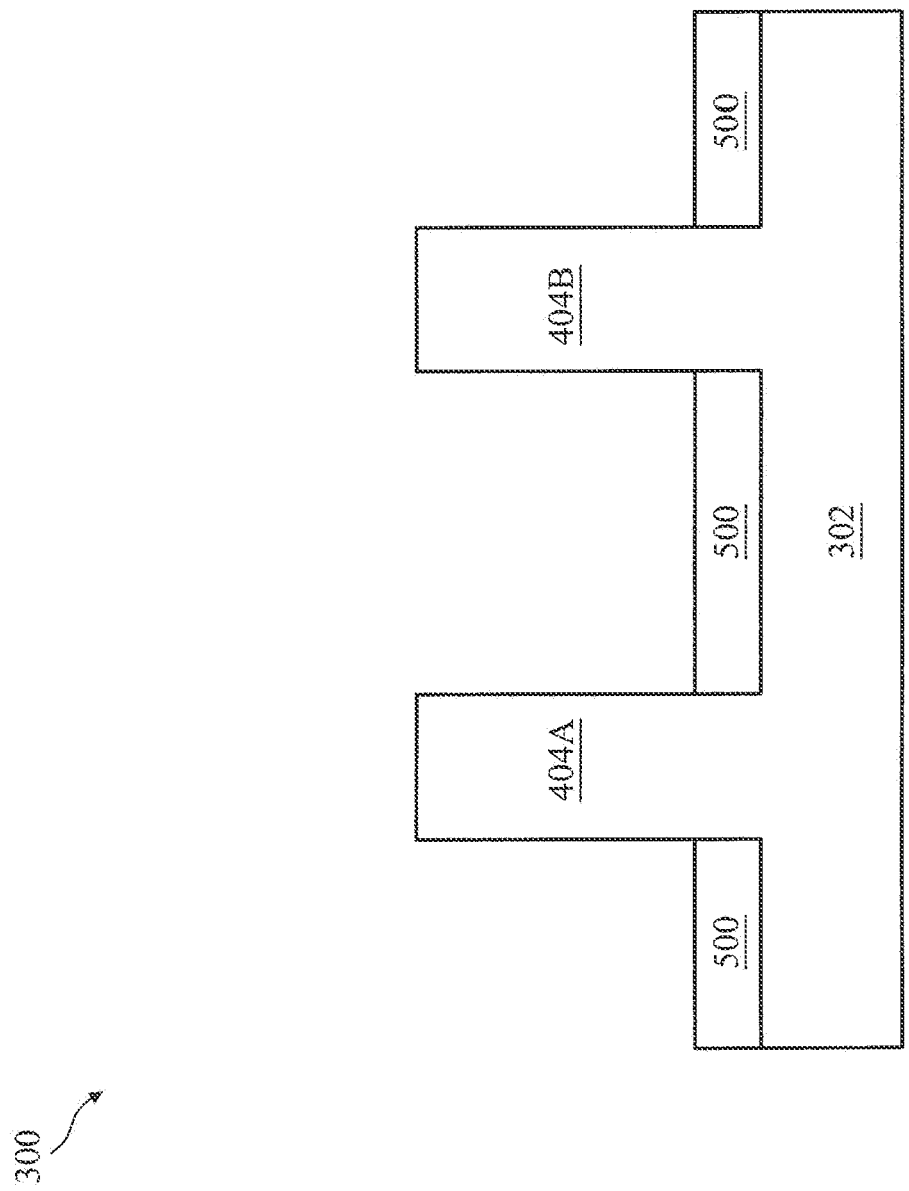

Corresponding to operation 206 of FIG. 2, FIG. 5 is a cross-sectional view of the FinFET device 300 including isolation regions 500 at one of the various stages of fabrication. The cross-sectional view of FIG. 5 is cut along the lengthwise direction of a dummy or an active gate structure (e.g., cross-section B-B, as indicated in FIG. 1).

The isolation regions 500, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 500 and a top surface of the fin 404 that are coplanar (not shown). The patterned mask 410 (FIG. 4) may also be removed by the planarization process.

In some embodiments, the isolation regions 500 include a liner, e.g., a liner oxide (not shown), at the interface between each of the isolation regions 500 and the substrate 302 (fin 404). In some embodiments, the liner oxide is formed to reduce crystalline defects at the interface between the substrate 302 and the isolation region 500. Similarly, the liner oxide may also be used to reduce crystalline defects at the interface between the fin 404 and the isolation region 500. The liner oxide (e.g., silicon oxide) may be a thermal oxide formed through a thermal oxidation of a surface layer of the substrate 302, although other suitable method may also be used to form the liner oxide.

Next, the isolation regions 500 are recessed to form shallow trench isolation (STI) regions 500, as shown in FIG. 5. The isolation regions 500 are recessed such that the upper portions of the fin 404 protrude from between neighboring STI regions 500. Respective top surfaces of the STI regions 500 may have a flat surface (as illustrated), a convex surface, a concave surface (such as dishing), or combinations thereof. The top surfaces of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

FIGS. 3 through 5 illustrate an embodiment of forming the fin 404, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the fin 404 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fin 404 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
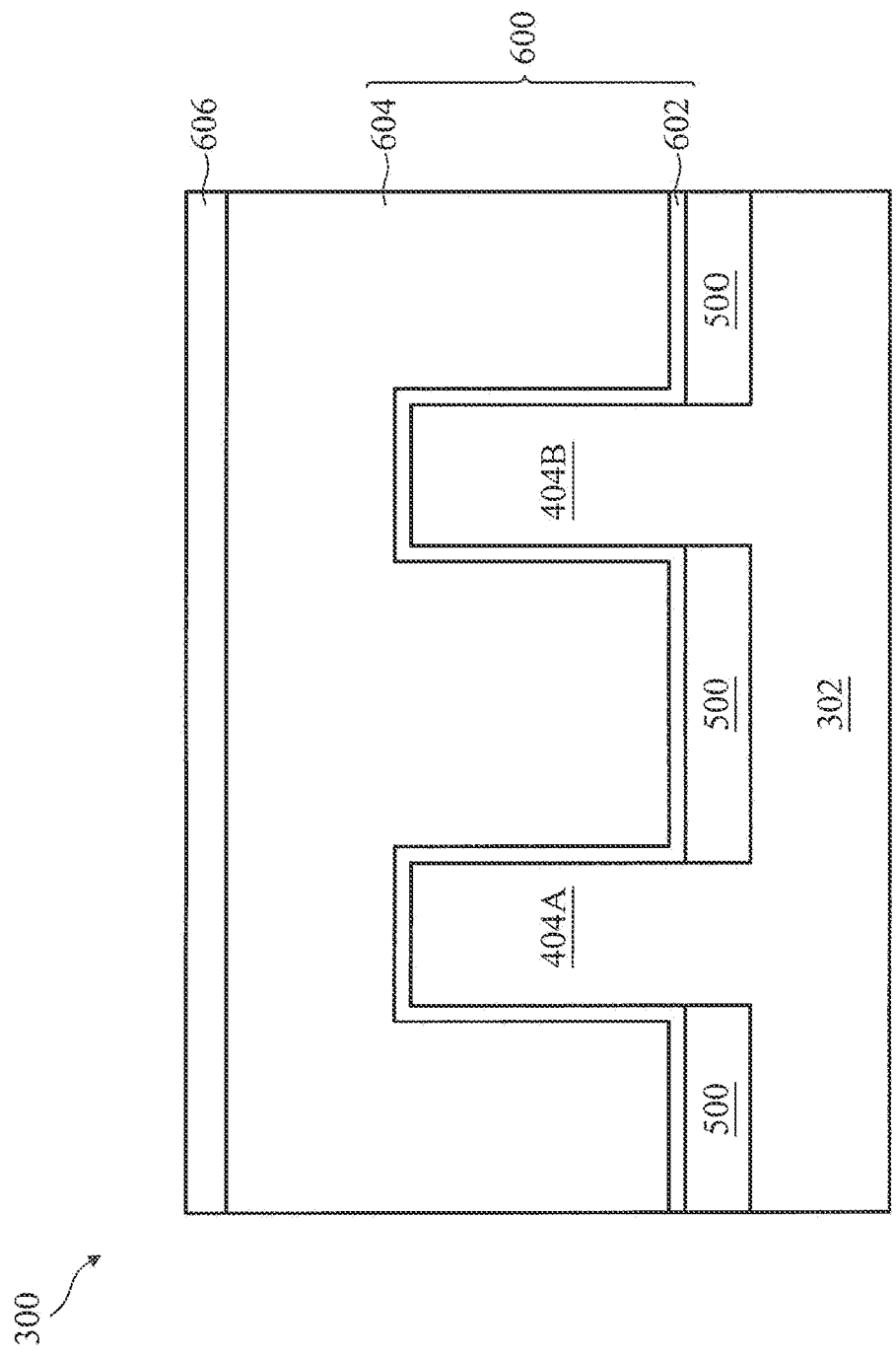

Corresponding to operation 208 of FIG. 2, FIG. 6 is a cross-sectional view of the FinFET device 300 including a dummy gate structure 600 at one of the various stages of fabrication. The cross-sectional view of FIG. 6 is cut along the lengthwise direction of a dummy or an active gate structure (e.g., cross-section B-B, as indicated in FIG. 1).

The dummy gate structure 600 includes a dummy gate dielectric 602 and a dummy gate 604, in some embodiments. A mask 606 may be formed over the dummy gate structure 600. To form the dummy gate structure 600, a dielectric layer is formed on the fin 404. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form the mask 606. The pattern of the mask 606 then may be transferred to the gate layer and the dielectric layer by an acceptable etching technique to form the dummy gate 604 and the underlying dummy gate dielectric 602, respectively. The dummy gate 604 and the dummy gate dielectric 602 cover a central portion (e.g., a channel region) of the fin 404. The dummy gate 604 may also have a lengthwise direction (e.g., direction B-B of FIG. 1) substantially perpendicular to a lengthwise direction (e.g., direction of A-A of FIG. 1) of the fin 404.

The dummy gate dielectric 602 is shown to be formed over the fin 404 (e.g., over top surfaces and sidewalls of each fin structures 404A-B) and over the STI regions 500 in the example of FIG. 6. In other embodiments, the dummy gate dielectric 602 may be formed by, e.g., thermal oxidization of a material of the fin 404, and therefore, may be formed over the fin 404 but not over the STI regions 500. It should be appreciated that these and other variations are still included within the scope of the present disclosure.

An example gate-last process (sometimes referred to as replacement gate process) is performed subsequently to replace the dummy gate structures 600 with an active gate structure (which may also be referred to as a replacement gate structure or a metal gate structure). Prior to removing the dummy gate structure 600, a number of features/structures may have been formed in the FinFET device 300. For example, a gate spacer disposed on sides of the dummy gate structure 600, source/drain structures formed in the fin 404 (e.g., on the sides of the dummy gate structure 600 with the gate spacer disposed therebetween), an interlayer dielectric (ILD) disposed over the source/drain structures, etc. Such structures will be briefly discussed in FIG. 7 that is a cross-sectional view of the FinFET device 300 cut along the lengthwise direction of one of the fin structures 404A (e.g., cross-section A-A, as shown in FIG. 1). The fin structure 404A has been selected as a representative example for the following figures cut along the cross-section A-A, and thus, it should be understood that over the fin structure 404B (and other non-shown fin structures), the FinFET device 300 can include similar features/structures.

Figure 7:
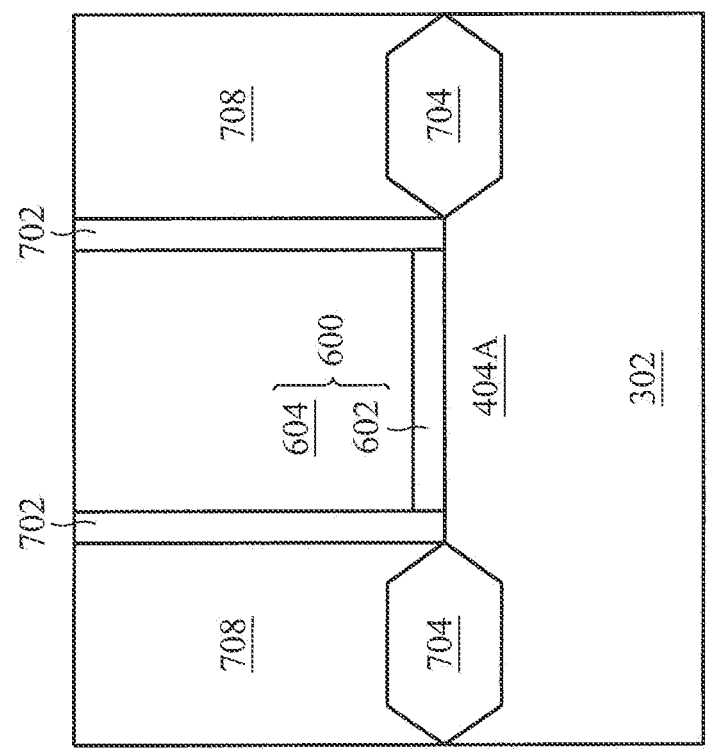

As shown in FIG. 7, the FinFET device 300 includes gate spacers 702 extending along sidewalls of the dummy gate structure 600. The gate spacer 702 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer. Separated from the dummy gate structure 600 by the gate spacers 702, source/drain structures 704 are formed in the fin structure 404A. The source/drain structures 704 are formed by epitaxially growing a semiconductor material in recesses of the fin structure 404A, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. After forming the source/drain structures 704, the ILD 708 is formed over the source/drain structures 704. The ILD 708 includes a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Figure 8A:
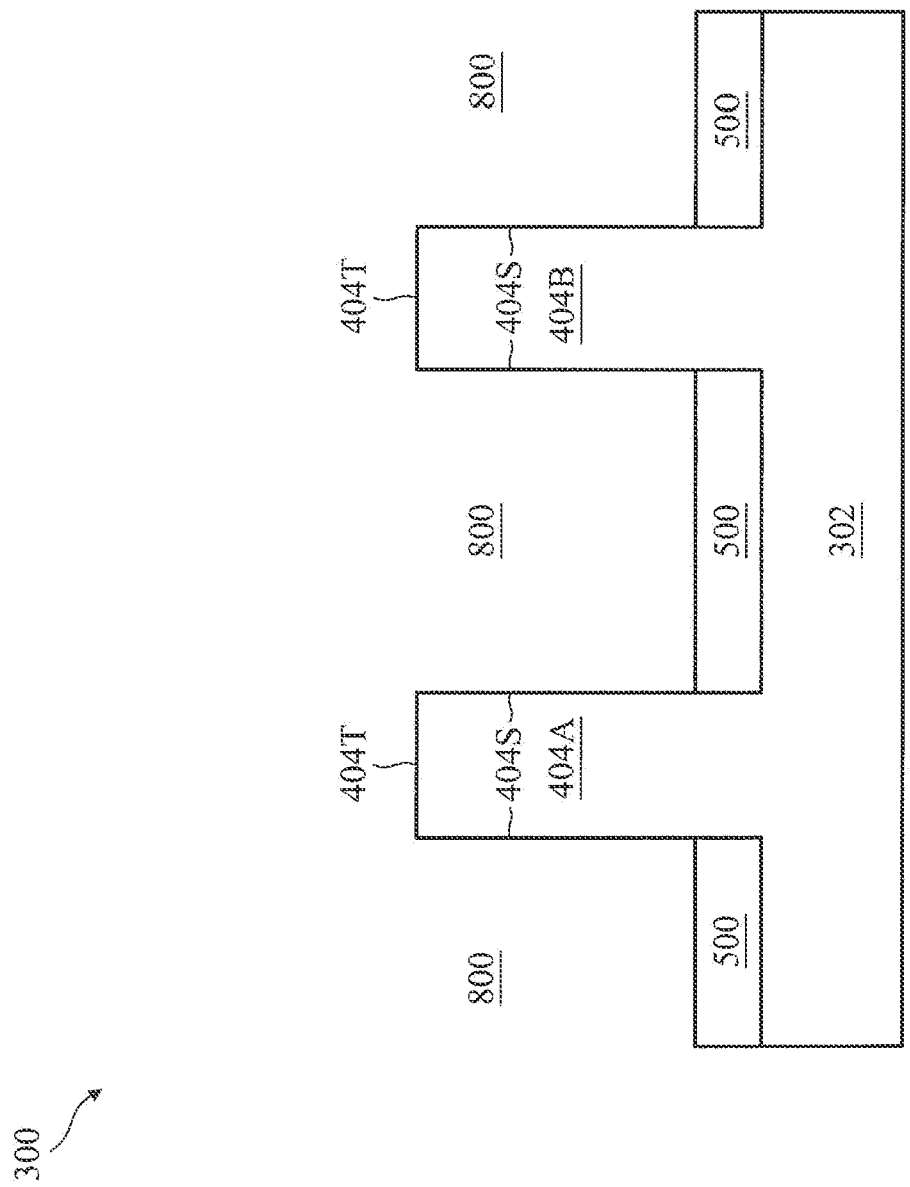

Corresponding to operation 210 of FIG. 2, FIG. 8A is a cross-sectional view of the FinFET device 300 in which the dummy gate structure 600 (FIG. 7) is removed to form a gate trench 800, at one of the various stages of fabrication. The cross-sectional view of FIG. 8A is cut along the lengthwise direction of a dummy or an active gate structure (e.g., cross-section B-B, as indicated in FIG. 1). Corresponding to the same operation, FIG. 8B is another cross-sectional view of the FinFET device 300 cut along the lengthwise direction of one of the fin structures 404A (e.g., cross-section A-A, as shown in FIG. 1).

Figure 8B:
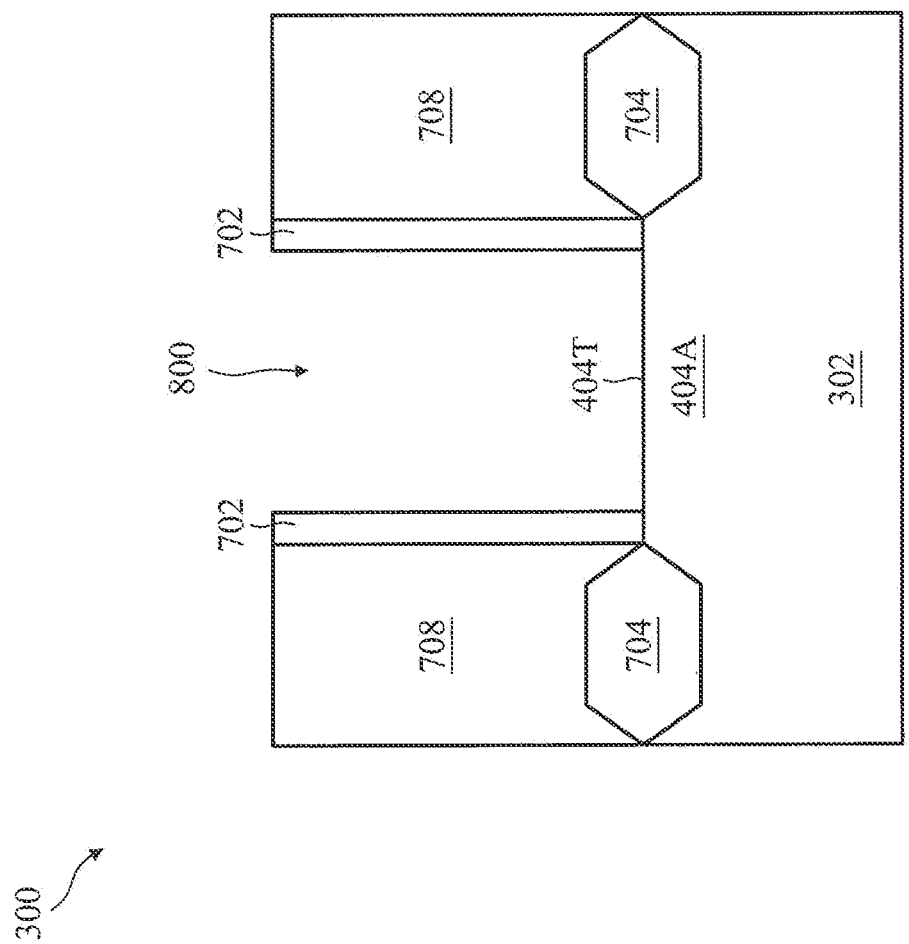

To remove the dummy gate structure 600, one or more etching steps are performed to remove the dummy gate 604 and then the dummy gate dielectric 602, so that the gate trench 800 (which may also be referred to as a recess) is formed between the gate spacers 702 (as better illustrated in FIG. 8B). The gate trench 800 can expose a channel region of the fin structure 404 (e.g., 404A in FIG. 8B). During the dummy gate removal, the dummy gate dielectric 602 may be used as an etch stop layer when the dummy gate 604 is etched. The dummy gate dielectric 602 may then be removed after the removal of the dummy gate 604. Upon removing the dummy gate structure 600 (or forming the gate trench 800), a top surface 404T and sidewalls 404S of each of the fin structures 404 can be exposed, which can be better illustrated in the cross-sectional view of FIG. 8A.

Figure 9:
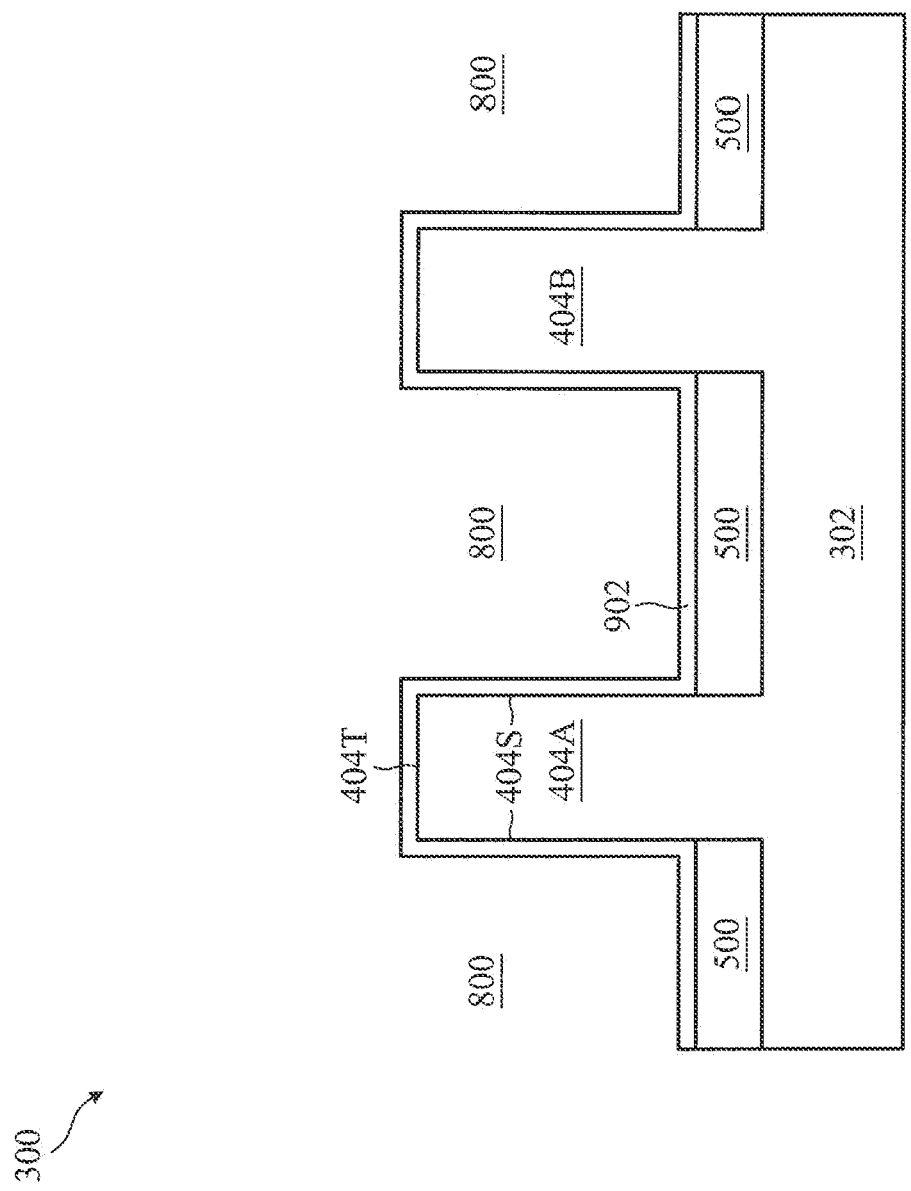

Corresponding to operation 212 of FIG. 2, FIG. 9 is a cross-sectional view of the FinFET device 300 including a first interfacial layer 902, at one of the various stages of fabrication. The cross-sectional view of FIG. 9A is cut along the lengthwise direction of a dummy or an active gate structure (e.g., cross-section B-B, as indicated in FIG. 1).

The first interfacial layer 902 may be (e.g., conformally) formed over the fin structures 404A-B. For example, the first interfacial layer 902 can overlay the top surface 404T of each fin structure and extend along the sidewalls 404S of each fin structure, as shown in FIG. 9. The first interfacial layer 902, which is formed of silicon oxide (e.g., $SiO_x$), can have a thickness ranging between 0.5 nanometers (nm) and about 2 nm, as an example. To form the first interfacial layer 902, a wet chemical solution (e.g., $H_2SO_4$ mixed with $H_2O_2$) may be applied over the workpiece under an elevated temperature, e.g., between about 50° C. and about 150° C.

Figure 10:
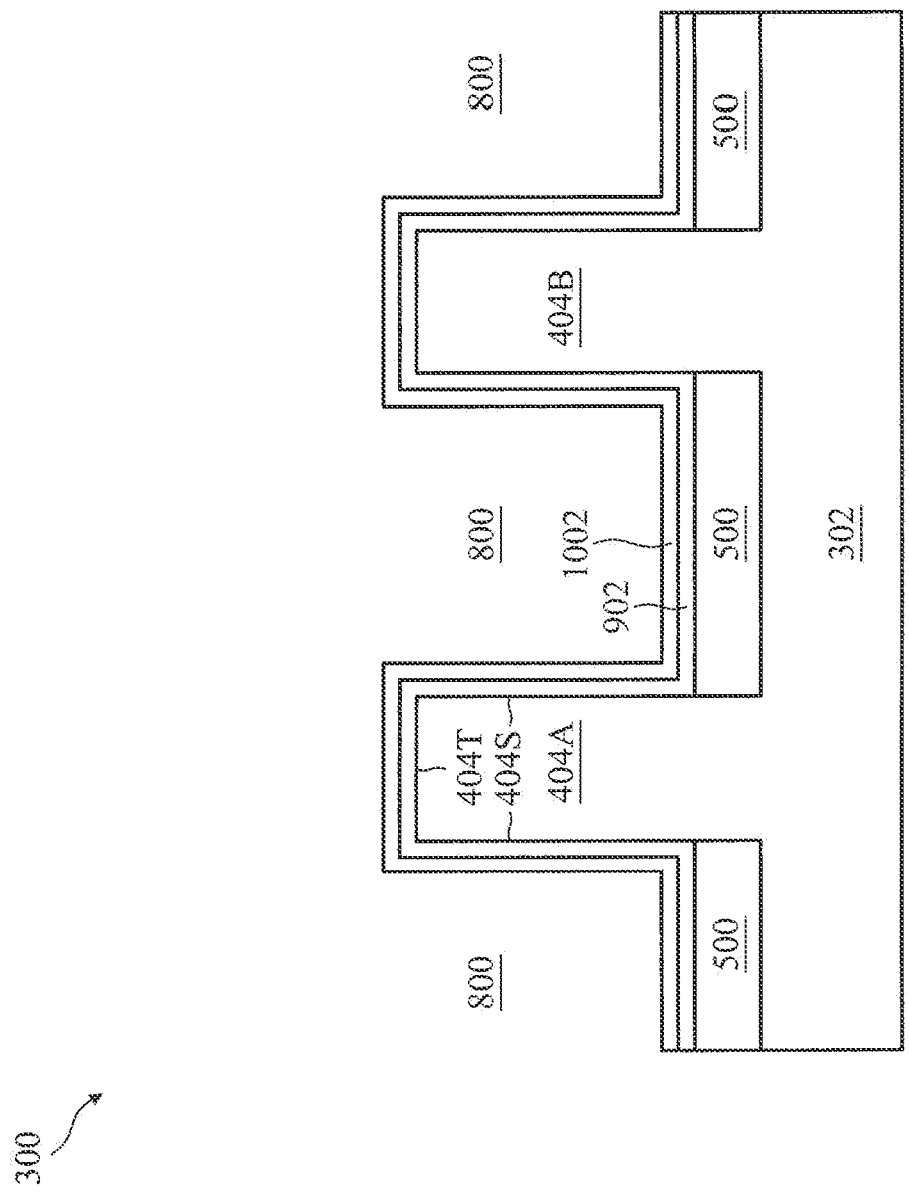

Corresponding to operation 214 of FIG. 2, FIG. 10 is a cross-sectional view of the FinFET device 300 including a gate dielectric layer 1002 at one of the various stages of fabrication. The cross-sectional view of FIG. 10 is cut along the lengthwise direction of a dummy or an active gate structure (e.g., cross-section B-B, as indicated in FIG. 1).

The gate dielectric layer 1002 is formed (e.g., deposited) conformally over the first interfacial layer 902 in the gate trench 800. For example, with the first interfacial layer 902 disposed therebetween, the gate dielectric layer 1002 is disposed, such as on the top surface and along the sidewalls of each fin structure 404A-B, and on respective top surfaces and along respective sidewalls of the gate spacers 702 and the ILD 708 (not shown in this cross-sectional view of FIG. 10). In accordance with some embodiments, the gate dielectric layer 1002 includes silicon oxide, silicon nitride, or multilayers thereof. In example embodiments, the gate dielectric layer 1002 includes a high-k dielectric material, and in these embodiments, the gate dielectric layers 1002 may have a k value greater than about 7.0, and may include a metal oxide or a silicate of Hf, Al, Zr, La, Mg, Ba, Ti, Pb, and combinations thereof. The formation methods of gate dielectric layer 1002 may include molecular beam deposition (MBD), atomic layer deposition (ALD), PECVD, and the like. A thickness of the gate dielectric layer 1002 may be between about 8 angstroms (Å) and about 20 angstroms, as an example. A thickness of the gate dielectric layer 1002 may be between about 5 nanometer (nm) and about 25 nm, as another example.

Figure 11:
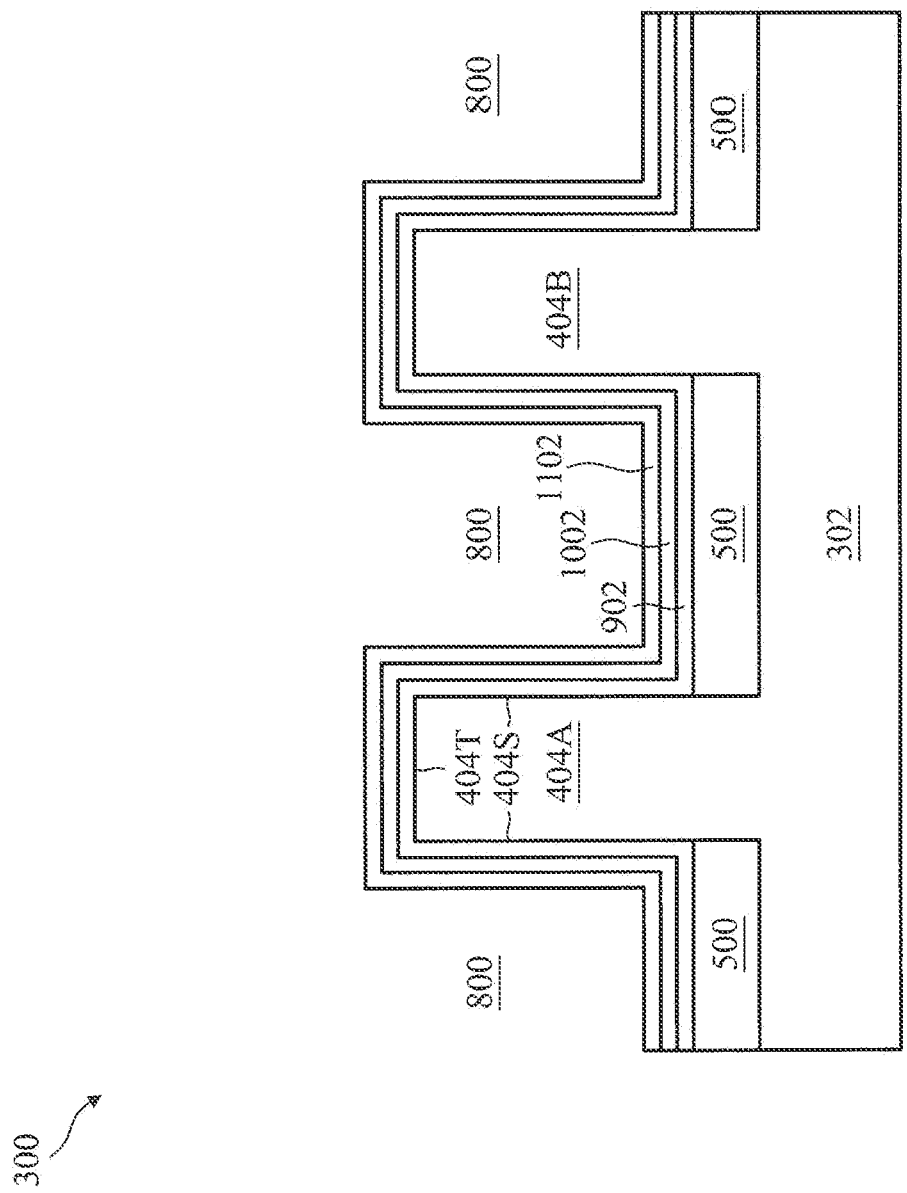

Corresponding to operation 216 of FIG. 2, FIG. 11 is a cross-sectional view of the FinFET device 300 including a sacrificial layer 1102 at one of the various stages of fabrication. The cross-sectional view of FIG. 11 is cut along the lengthwise direction of a dummy or an active gate structure (e.g., cross-section B-B, as indicated in FIG. 1).

The sacrificial layer 1102 is formed (e.g., deposited) conformally over the gate dielectric layer 1002 in the gate trench 800. For example, with the gate dielectric layer 1002 disposed therebetween, the sacrificial layer 1102 is disposed on the top surface and along the sidewalls of each fin structure 404A-B, and on respective top surfaces and along respective sidewalls of the gate spacers 702 and the ILD 708 (not shown in this cross-sectional view of FIG. 11). The formation methods of sacrificial layer 1102 may include molecular beam deposition (MBD), atomic layer deposition (ALD), PECVD, and the like. In accordance with some embodiments, the sacrificial layer 1102 includes a material that allows it to be removed (e.g., etched) by an isotropic etching process (e.g., applying a certain wet etching solution). For example, the sacrificial layer 1102 may include titanium nitride (TiN), tantalum nitride (TaN), titanium aluminium nitride (TiAlN), tungsten nitride (WN, $WN_2$, $W_2N$), tungsten carbide (WC), aluminium oxide ($AlO_x$), lanthanum oxide ($LaO_x$), or combinations thereof. Such a wet etching solution may be applied over the workpiece after modifying the etching characteristic of a portion of the gate dielectric layer, which will be discussed in further detail below.

Figure 12:
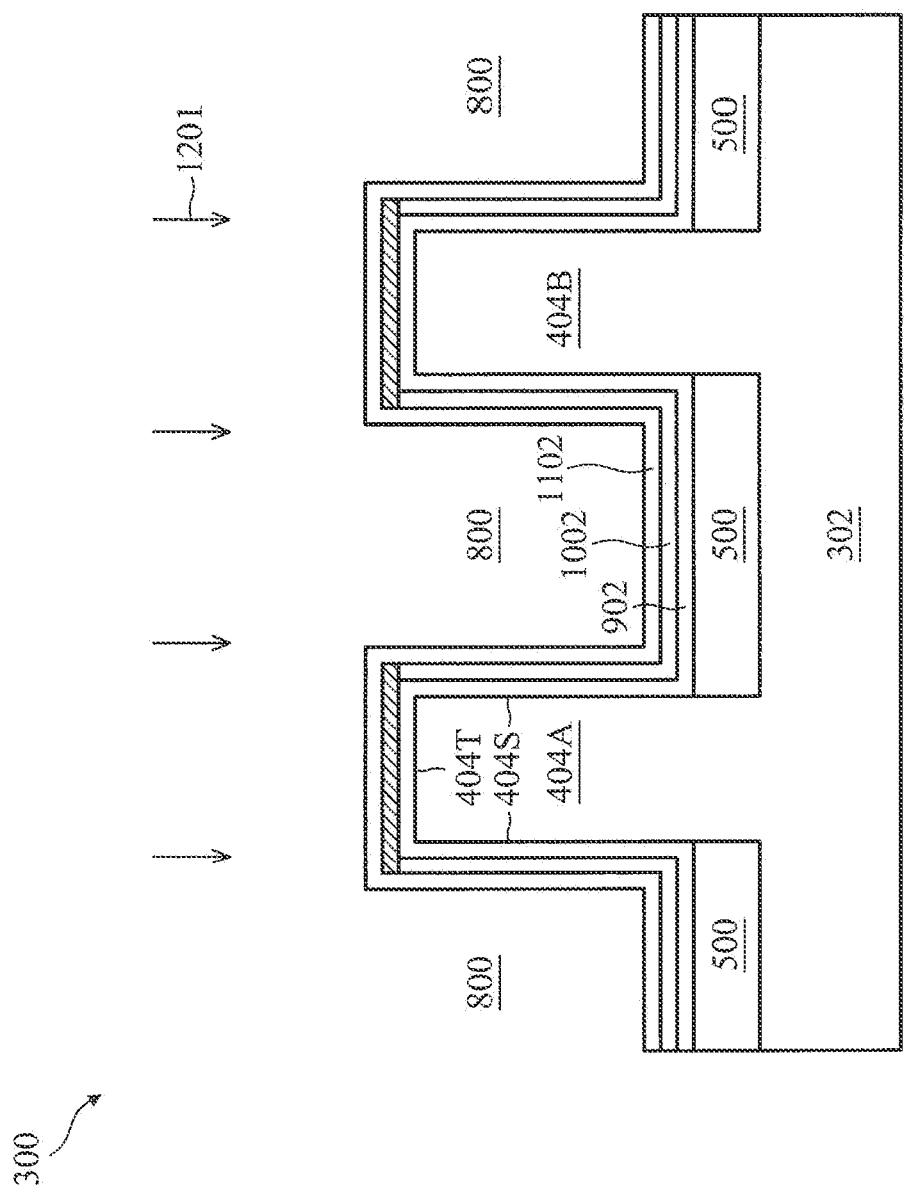

Corresponding to operation 218 of FIG. 2, FIG. 12 is a cross-sectional view of the FinFET device 300 in which an anisotropic (e.g., dry) etching process 1201 is performed to modify the etching characteristic of a portion of the gate dielectric layer 1002 at one of the various stages of fabrication. The cross-sectional view of FIG. 12 is cut along the lengthwise direction of a dummy or an active gate structure (e.g., cross-section B-B, as indicated in FIG. 1).

In various embodiments, based on the anisotropic characteristic of the dry etching process 1201, the portion of the gate dielectric layer 1002 that overlays the top surface 404T (filled in diagonal patterns in FIG. 12) may be bombarded by the dry etching process 1201, while the portion of the gate dielectric layer 1002 that extends along the sidewalls 404S may remain substantially intact. As a result, the etching characteristic of such a "top" portion of the gate dielectric layer 1002 may be changed. For example, this top portion may be mixed with the sacrificial layer 1102, and may collectively present a similar etching characteristic. In certain cases where a spacing between adjacent fin structures is narrow enough (e.g., less than 50 nm), the etching characteristic of a portion of the gate dielectric layer 1002 between the fin structures (e.g., over the isolation region 500) may not be significantly changed.

The dry etching process 1201 can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof.

Figure 13:
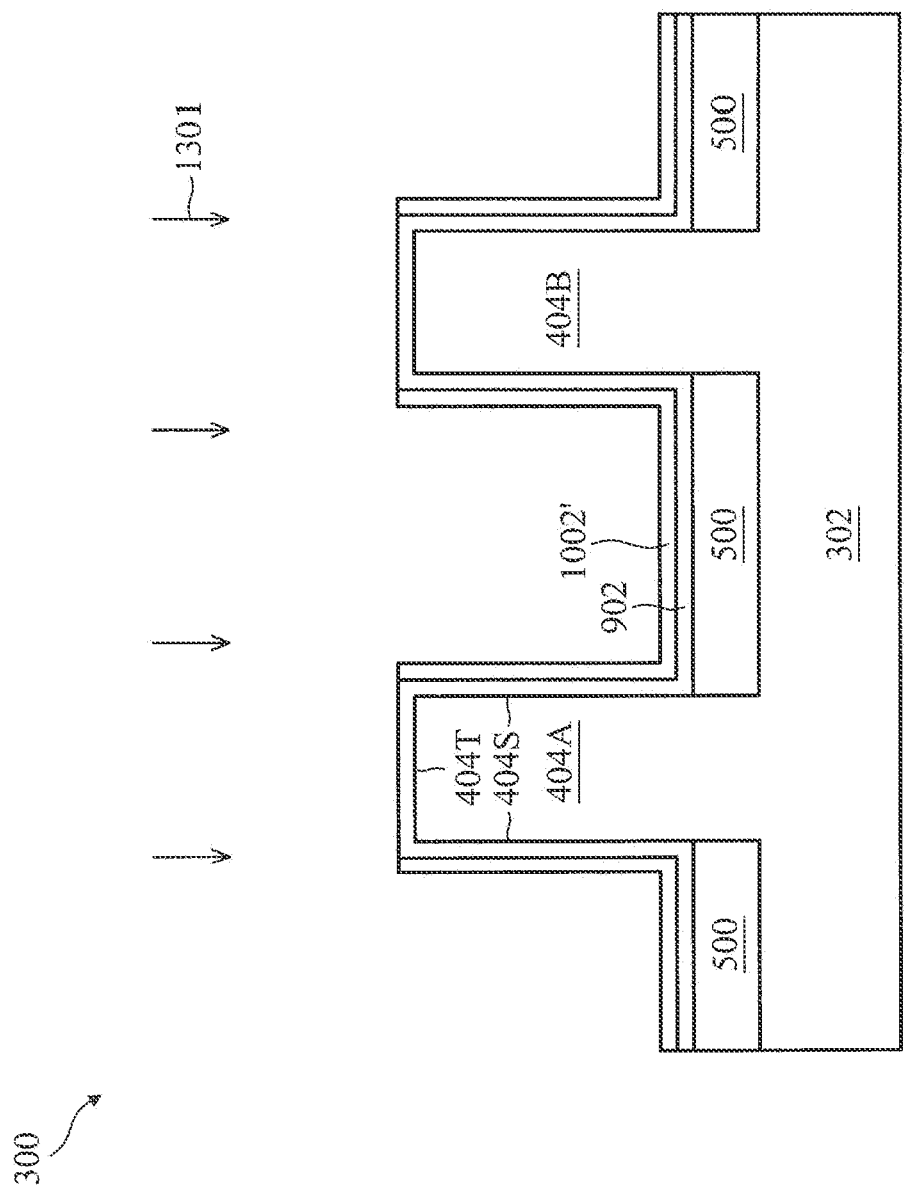

Corresponding to operation 220 of FIG. 2, FIG. 13 is a cross-sectional view of the FinFET device 300 in which an isotropic (e.g., wet) etching process 1301 is performed to remove the sacrificial layer 1102 and the top portion of the gate dielectric layer 1002 (shown in FIG. 12) at one of the various stages of fabrication. The cross-sectional view of FIG. 13 is cut along the lengthwise direction of a dummy or an active gate structure (e.g., cross-section B-B, as indicated in FIG. 1).

In various embodiments, the wet etching process 1301 includes applying a wet etching solution over the workpiece shown in FIG. 12 (e.g., over the sacrificial layer 1102). Due to the modified etching characteristic of the top portion of the gate dielectric layer 1002, the top portion can be concurrently removed with the sacrificial layer 1102 through the wet etching process 1301. The remaining portion of the gate dielectric layer 1002 may hereinafter referred to as gate dielectric layer 1002'. The gate dielectric layer 1002' can remain extending along the sidewalls 404S, with the first interfacial layer 902 disposed therebetween. As such, a portion of the first interfacial layer 902 (e.g., the portion overlaying the top surface 404T) may be exposed. Such an exposed portion of the first interfacial layer 902 that includes silicon allows a second interfacial layer to be regrown over the top surface 404T, which will be discussed in further detail below.

The wet etching solution of the wet etching process 1301 can include a solution selected from the group consisting of: ammonium hydroxide ($NH_4OH$), hydrogen chloride (HCl), sulfuric acid ($H_2SO_4$), phosphoric acid ($H_3PO_4$), nitric acid ($HNO_3$), and combinations thereof. The solution can mix with an oxidizer (e.g., hydrogen peroxide ($H_2O_2$) or water ($H_2O$)). As a non-limiting example, a respective concentration/quantity of each of the solutions may include: $NH_4OH$ in about 0.1~15M; HCl in about 0.1~12M; $H_2SO_4$ in about 0.1~18M; $H_3PO_4$ in about 0.1~18M; and $HNO_3$ in about 0.1~16M.

Figure 14:
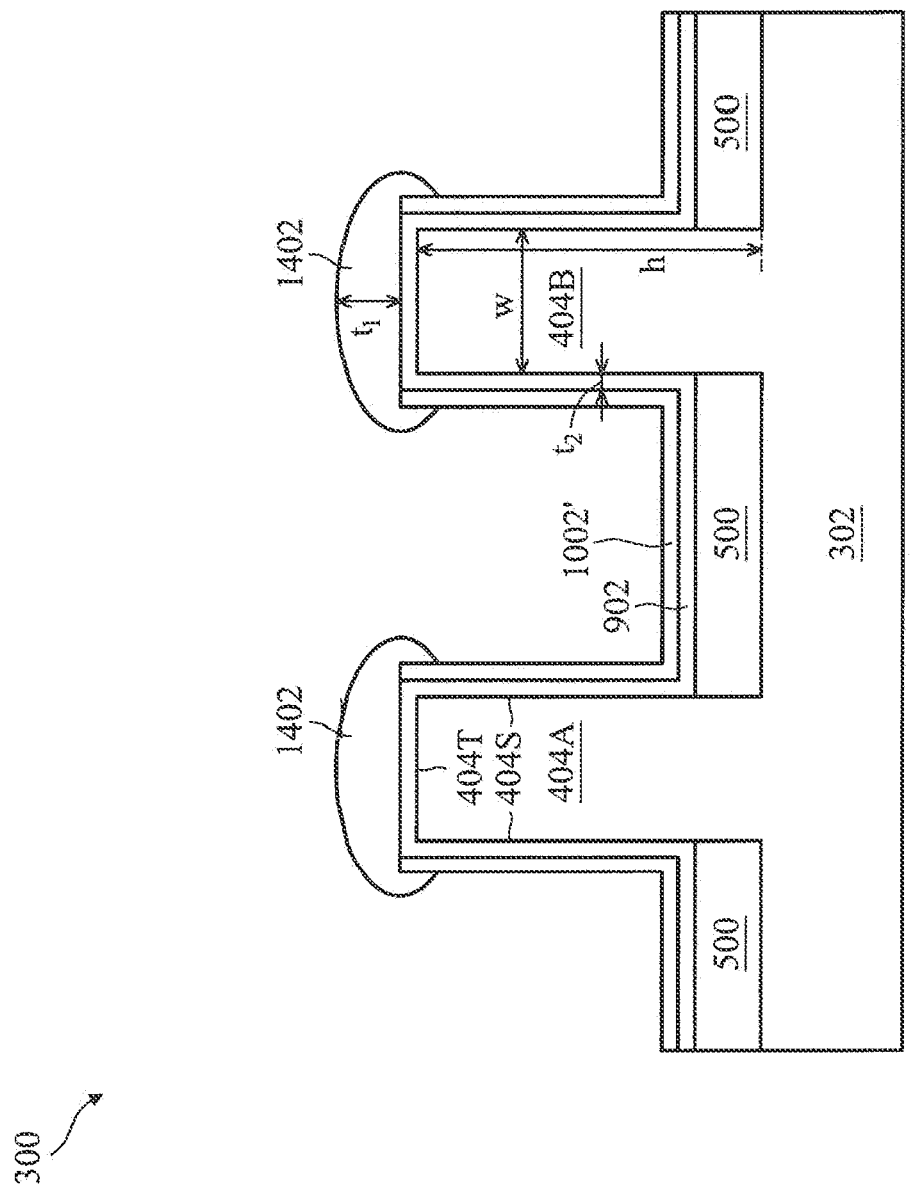

Corresponding to operation 222 of FIG. 2, FIG. 14 is a cross-sectional view of the FinFET device 300 including a second interfacial layer 1402 at one of the various stages of fabrication. The cross-sectional view of FIG. 14 is cut along the lengthwise direction of a dummy or an active gate structure (e.g., cross-section B-B, as indicated in FIG. 1).

The second interfacial layer 1402 is formed to again overlay the exposed portion of the first interfacial layer 902. Alternatively stated, the second interfacial layer 1402 overlays the top surface 404T, with the first interfacial layer 902 disposed therebetween. As further shown in FIG. 14, the second interfacial layer 1402 may be formed in a mushroom-like shape, which, in addition to overlaying the exposed portion of the first interfacial layer 902, can downwardly extend along sidewalls of the remaining gate dielectric layer 1002'. In various embodiments, the second interfacial layer 1402 may be characterized with a thickness ($t_1$) that is measured from the top surface of the remaining gate dielectric layer 1002' over the top surface 404T to the uppermost point of the second interfacial layer 1402. The thickness $t_1$ may be adjustable according to the dimensions of the fin structure 404 and/or a thickness of the first interfacial layer 902. For example, a ratio of the thickness $t_1$ to a width of the fin structure 404 (w) is between about 0.01 and about 5; a ratio of the thickness $t_1$ to a height of the fin structure 404 (h) is between about 0.001 and about 0.5; and a ratio of the thickness $t_1$ to a thickness of the first interfacial layer 902 ($t_2$) is between about 0.05 and about 20.

The second interfacial layer 1402, which can also include silicon oxide (e.g., $SiO_x$), e.g., similar as the first interfacial layer 902. However, as will be discussed as follows, the second interfacial layer 1402 is formed in a different technique from the first interfacial layer 902, for example, in a higher temperature. As such, the second interfacial layer 1402 may be characterized with a higher density and/or with a less porosity than the first interfacial layer 902, which may provide further protection for the fin structures 404 (e.g., top surface 404T) in the subsequent process(es).

To form the second interfacial layer 1402, an ahsing process may be performed. As a non-limiting example, an ashing process, including a gas, can be performed over the workpiece at an elevated temperature between about 150° C. and about 300° C. The gas can be selected from the group consisting of: nitrogen ($N_2$), hydrogen ($H_2$), oxygen ($O_2$), and combinations thereof. In some embodiments, such an ahsing process may grow the second interfacial layer 1402 over a surface that has dangling silicon bonds such as, for example, the exposed portion of the first interfacial layer 902. Additionally, the second interfacial layer 1402 can laterally extend over the exposed portion of the first interfacial layer 902, which in turn can downwardly extend along the sidewalls 404S.

Figure 15:
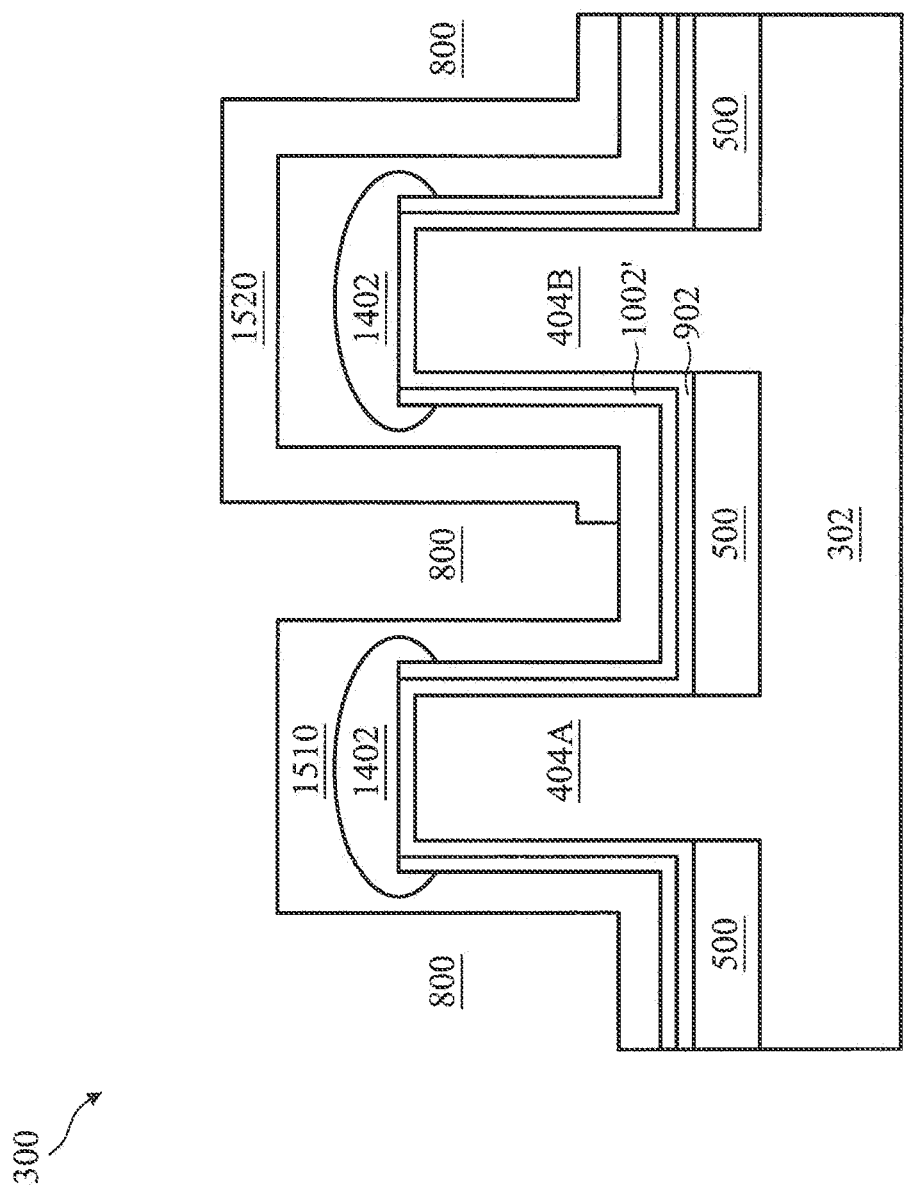

Corresponding to operation 224 of FIG. 2, FIG. 15 is a cross-sectional view of the FinFET device 300 including different combinations of first work function layer 1510 and/or second work function layer 1520 over the fin structures 404A and 404B, respectively, at one of the various stages of fabrication. The cross-sectional view of FIG. 15 is cut along the lengthwise direction of a dummy or an active gate structure (e.g., cross-section B-B, as indicated in FIG. 1). Although two work function layers are shown to constitute different combinations over the fin structures 404A-B, it should be understood that each of the combinations can have any desired number of work function layers, while remaining within the scope of the present disclosure.

To form the different combinations of work function layers, the first work function layer 1510 is deposited (e.g., conformally) in the gate trench 800 over the gate dielectric layer 1102' and the second interfacial layer 1402, with the first interfacial layer 902 disposed beneath. Next, the second work function layer 1520 is deposited (e.g., conformally) over the first work function layer 1510. Next, one or more patterning (e.g., etching) processes are performed to remove a portion of the work function layers.

For example in FIG. 15, a portion of the second work function layer 1520 that overlays the fin structure 404A may be removed, while the fin structure 404B may be still straddled by both of the work function layers 1510 and 1520. Consequently, the different combinations of the work function layers 1510 and 1520 can provide different threshold voltages for the transistors adopting the fin structures 404A and 404B as their channels, respectively. In another example to form different combinations of the work function layers, a portion of the second work function layer 1520 and a portion of the first work function layer 1510 that overlay the fin structure 404A may both be removed, while the fin structure 404B may be still straddled by both of the work function layers 1510 and 1520. By forming the second interfacial layer 1402 over the top surface 404T, the fin structures 404 can be further protected during such removal processes of the work function layers.

The first and second work function layers 1510 and 1520 may each be a P-type work function layer, an N-type work function layer, multi-layers thereof, or combinations thereof. In the discussion herein, a work function layer may also be referred to as a work function metal. Example P-type work function metals include TiN, TaN, Ru, Mo, Al, WN, $ZrSi_2$, $MoSi_2$, $TaSi_2$, $NiSi_2$, WCN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. The work function layer(s) may be deposited by CVD, physical vapor deposition (PVD), ALD, and/or other suitable process. A thickness of a P-type work function layer may be between about 8 Å and about 15 Å, and a thickness of an N-type work function layer may be between about 15 Å and about 30 Å, as an example. A thickness of a P-type work function layer may be between about 5 nanometer (nm) and about 25 nm, and a thickness of an N-type work function layer may be between about 5 nm and about 25 nm, as another example.

Figure 16:
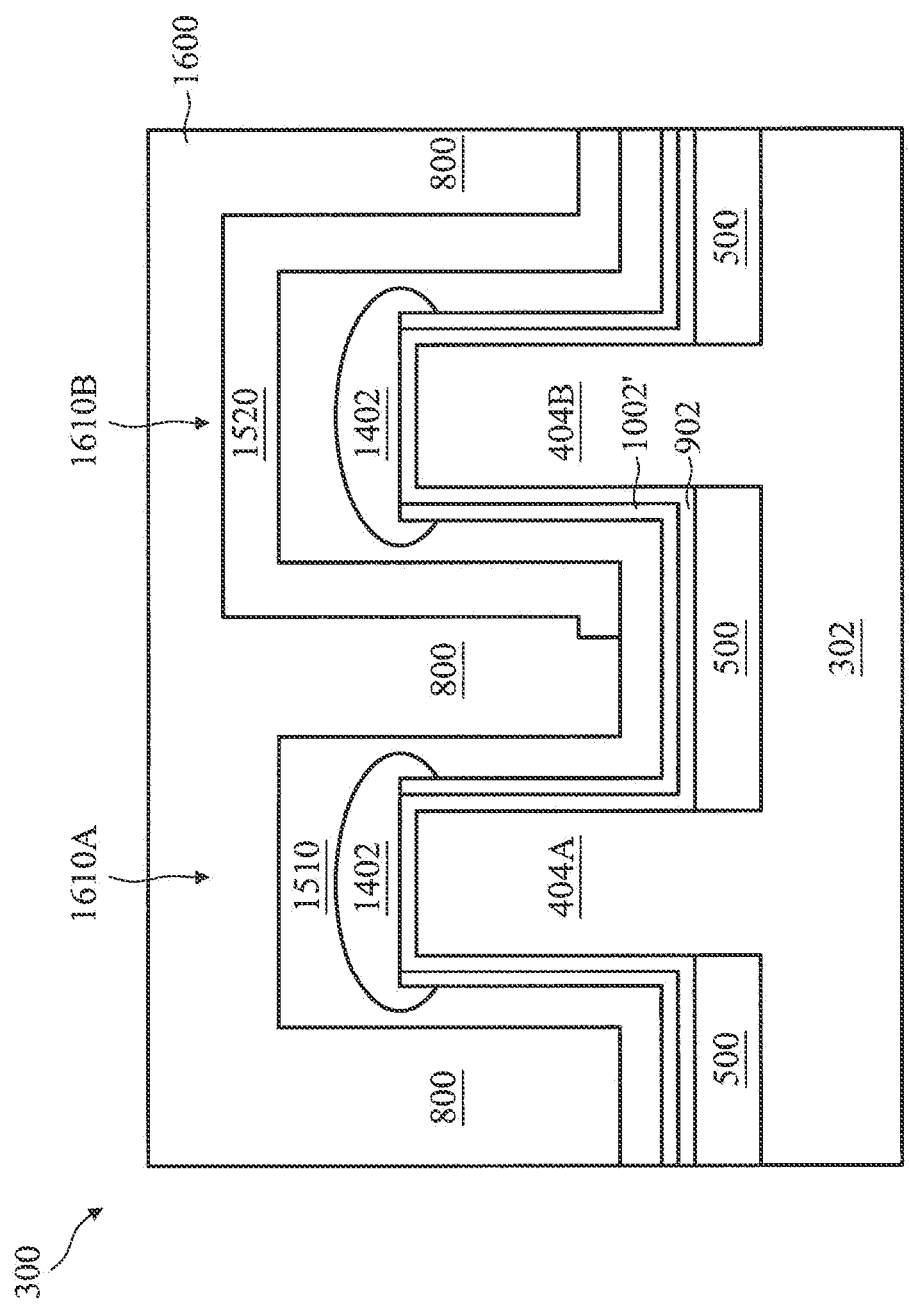

Corresponding to operation 226 of FIG. 2, FIG. 16 is a cross-sectional view of the FinFET device 300 including a metal fill 1600 at one of the various stages of fabrication. The cross-sectional views of FIG. 16 is cut along the lengthwise direction of a dummy or an active gate structure (e.g., cross-section B-B, as indicated in FIG. 1).

The metal fill 1600 can fill the gate trench 800 to form active gate structures 1610A and 1610B straddling the fin structures 404A and 404B, respectively. For example, the active gate structure 1610A includes the metal fill 1600 and the combination of the work function layer(s) (e.g., 1510 in the present example), with the gate dielectric layer 1002' disposed between it and the fin structure 404A that is configured as a channel; and the active gate structure 1610B includes the metal fill 1600 and the combination of the work function layer(s) (e.g., both 1510 and 1520 in the present example), with the gate dielectric layer 1002' disposed between it and the fin structure 404B that is configured as a channel. The metal fill 1600 may include a suitable metal, such as tungsten (W), formed by a suitable method, such as PVD, CVD, electroplating, electroless plating, or the like. Besides tungsten, other suitable material, such as copper (Cu), gold (Au), cobalt (Co), combinations thereof, multi-layers thereof, alloys thereof, or the like, may also be used as the metal fill 1600.

In one aspect of the present disclosure, a semiconductor device is disclosed. The semiconductor device includes a fin structure disposed over a substrate. The semiconductor device includes a first dielectric layer straddling the fin structure. The semiconductor device includes a gate dielectric layer disposed over the first dielectric layer, exposing a portion of the first dielectric layer disposed above a top surface of the fin structure. The semiconductor device includes a second dielectric layer disposed above the top surface of the fin structure and in contact with the portion of the first dielectric layer. The semiconductor device further includes a gate structure straddling the fin structure.

In another aspect of the present disclosure, a semiconductor device is disclosed. The semiconductor device includes a fin structure disposed over a substrate. The semiconductor device includes a first dielectric layer disposed over the fin structure. The semiconductor device includes a gate dielectric layer disposed along sidewalls of the first dielectric layer. The semiconductor device includes a second dielectric layer disposed over a top portion of the fin structure, where the second dielectric layer directly contacts both the first dielectric layer and the gate dielectric layer. The semiconductor device further includes a gate structure disposed over the fin structure.

In yet another aspect of the present disclosure, a method for manufacturing a semiconductor device is disclosed. The method includes forming a gate trench over a fin structure. The method includes forming a first dielectric layer over the fin structure in the gate trench. The method includes forming a gate dielectric layer over the first dielectric layer. The method includes etching the gate dielectric layer to expose the first dielectric layer. The method includes forming a second dielectric layer over the etched gate dielectric layer, where the second dielectric layer directly contacts a top surface of the first dielectric layer. The method further includes forming a gate structure over the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a fin structure disposed over a substrate;
   a first dielectric layer straddling the fin structure;
   a gate dielectric layer disposed over the first dielectric layer, exposing a portion of the first dielectric layer disposed above a top surface of the fin structure;
   a second dielectric layer disposed above the top surface of the fin structure and in contact with the portion of the first dielectric layer; and
   a gate structure straddling the fin structure.

2. The semiconductor device of claim 1, wherein the second dielectric layer extends along upper portions of sidewalls of the fin structure.

3. The semiconductor device of claim 1, wherein a ratio of a thickness of the second dielectric layer to a width of the fin structure is between about 0.01 and about 5.

4. The semiconductor device of claim 1, wherein a ratio of a thickness of the second dielectric layer to a height of the fin structure is between about 0.001 and about 0.5.

5. The semiconductor device of claim 1, wherein a ratio of a thickness of the second dielectric layer to a thickness of the first dielectric layer is between about 0.05 and about 20.

6. The semiconductor device of claim 1, wherein the second dielectric layer has a mushroom-based shape that overlays the top surface of the fin structure.

7. The semiconductor device of claim 1, wherein the first and second dielectric layers both include silicon oxide.

8. A semiconductor device, comprising:
   a fin structure disposed over a substrate;
   a first dielectric layer disposed over the fin structure;
   a gate dielectric layer disposed along sidewalls of the first dielectric layer;
   a second dielectric layer disposed over a top portion of the fin structure, wherein the second dielectric layer directly contacts both the first dielectric layer and the gate dielectric layer; and
   a gate structure disposed over the fin structure.

9. The semiconductor device of claim 8, wherein a top surface of the first dielectric layer and the second dielectric layer are disposed between the top surface of the fin structure and the gate structure.

10. The semiconductor device of claim 8, wherein the first and the second dielectric layers have the same composition but different densities.

11. The semiconductor device of claim 8, wherein the second dielectric layer partially extends along top portions of sidewalls of the gate dielectric layer such that bottom portions of the sidewalls of the gate dielectric layer are free of contact with the second dielectric layer.

12. The semiconductor device of claim 8, wherein the second dielectric layer directly contacts a top surface of the first dielectric layer.

13. The semiconductor device of claim 8, wherein the gate structure directly contacts a bottom surface of the second dielectric layer.

14. The semiconductor device of claim 8, wherein the gate structure includes a work function layer, and wherein the work function layer wraps around the second dielectric layer.

15. A method of manufacturing a semiconductor device, comprising:
   forming a gate trench over a fin structure;
   forming a first dielectric layer over the fin structure in the gate trench;
   forming a gate dielectric layer over the first dielectric layer;
   etching the gate dielectric layer to expose the first dielectric layer;
   forming a second dielectric layer over the etched gate dielectric layer, wherein the second dielectric layer directly contacts a top surface of the first dielectric layer; and
   forming a gate structure over the second dielectric layer.

16. The method of claim 15, wherein the step of etching the gate dielectric layer includes:
   forming a sacrificial layer over the gate dielectric layer;
   performing a dry etching process to the sacrificial layer and the gate dielectric layer; and
   performing a wet etching process to remove the sacrificial layer and a portion of the gate dielectric layer to expose the top surface of the first dielectric layer.

17. The method of claim 16, wherein the sacrificial layer includes a material selected from the group consisting of: TiN, TaN, TiAlN, WN, WC, $AlO_x$, $LaO_x$, and combinations thereof.

18. The method of claim 15, wherein the step of forming the second dielectric layer includes performing an ash process using a gas selected from the group consisting of: $N_2$, $H_2$, $O_2$, and combinations thereof.

19. The method of claim 15, wherein the second dielectric layer is formed to directly contact an upper portion of sidewalls of the gate dielectric layer.

20. The method of claim 15, wherein the gate structure is formed to directly contact a bottom surface of the second dielectric layer.

* * * * *